United States Patent [19]
Nonaka et al.

[11] Patent Number: 5,218,238
[45] Date of Patent: Jun. 8, 1993

[54] BIAS VOLTAGE GENERATION CIRCUIT OF ECL LEVEL FOR DECREASING POWER CONSUMPTION THEREOF

[75] Inventors: Kazuyuki Nonaka; Tetsuya Aisaka, both of Kasugai, Japan

[73] Assignees: Fujitsu Limited; Fujitsu VLSI Limited, both of Kawasaki, Japan

[21] Appl. No.: 851,431

[22] Filed: Mar. 13, 1992

[30] Foreign Application Priority Data

Mar. 13, 1991 [JP] Japan .................................. 3-48205

[51] Int. Cl.$^5$ ........................ H03K 3/01; H03K 17/60
[52] U.S. Cl. .............................. 307/296.1; 307/296.3; 307/296.4; 307/296.6; 307/296.7; 307/570; 307/571
[58] Field of Search ............... 307/296.1, 296.3–296.4, 307/570–571, 296.6–296.7

[56] References Cited

U.S. PATENT DOCUMENTS

| | | | |
|---|---|---|---|
| 3,852,119 | 12/1974 | Gosney et al. | 357/23.1 |
| 4,639,661 | 1/1987 | Williams et al. | 323/317 |
| 4,713,560 | 12/1987 | Herndon | 307/296.3 |
| 4,958,094 | 9/1990 | Ishii et al. | 307/296.3 |
| 5,023,479 | 6/1991 | Jeffery et al. | 307/570 |

FOREIGN PATENT DOCUMENTS

0157905A2 10/1984 European Pat. Off. .
62-197987(A) 9/1987 Japan .

OTHER PUBLICATIONS

IBM Technical Disclosure Bulletin, IBM Corp. Standby Circuit for Power Savings, vol. 29, No. 4, pp. 1780–1782, Sep. 1986.

*Primary Examiner*—William L. Sikes
*Assistant Examiner*—Margaret R. Wambach
*Attorney, Agent, or Firm*—Staas & Halsey

[57] ABSTRACT

A bias voltage generation circuit comprises a bias voltage generation portion having a bias control node, a first switching unit, and a second switching unit. The bias voltage generation portion is used to generate a bias voltage of a predetermined potential and supply the bias voltage to an ECL circuit during an operation period, and the first switching unit is used to drop the bias voltage during a standby period in response to a bias voltage control signal. The second switching unit is used to switch OFF during the standby period to cut off a current flow through the bias control node and switch ON during the operation period to supply a current through the bias control node in response to the bias voltage control signal. Consequently, a current flow during the standby period can be reduced, and power consumption of the bias voltage generation circuit during the standby period is minimal.

12 Claims, 8 Drawing Sheets

BIAS VOLTAGE GENERATION CIRCUIT OF ECL LEVEL FOR DECREASING POWER CONSUMPTION THEREOF

BACKGROUND OF THE INVENTION

Field of the Invention

The present invention relates to a bias voltage generation circuit, more particularly, to a bias voltage generation circuit of an emitter coupled logic (ECL) level.

Description of the Related Art

Conventionally, high-speed LSIs are constituted by emitter coupled logic (ECL) circuits, but the ECL circuits require large amounts of power. In recent years, high-speed LSIs of low power consumption have been required to realize a battery backup system, and various techniques have been developed and proposed to meet the requirement.

One effective technique applying to ECL circuits is to make a standby state by dropping a bias voltage of the ECL circuits during a non-operation period, thereby saving on total power consumption during operation and non-operation periods. This technique externally controls the bias voltage of the ECL circuits generated by a bias voltage generation circuit. Power consumption is further reduced when the bias voltage generation circuit itself has a low power consumption.

SUMMARY OF THE INVENTION

An object of the present invention is to provide a bias voltage generation circuit having small consumption power during a standby period. Namely, an object of the present invention is to reduce current flow to a negligible amount (less than about 10 microamperes: $\mu$A) during a standby period.

According to the present invention, there is provided a bias voltage generation circuit including a first power supply line; a second power supply line; and a bias voltage generation portion having a bias control node, connected between the first power supply line and the second power supply line, for generating a bias voltage of a predetermined potential and supplying the bias voltage to a circuit during an operation period. The bias voltage generation circuit also includes a first switching unit, connected between the bias control node of the bias voltage generation portion and the second power supply line, for dropping the bias voltage during a standby period in accordance with a bias voltage control signal; and a second switching unit, connected between the bias control node and the first power supply line, for switching OFF during the standby period to cut off a current flowing through the bias control node and switching ON during the operation period to supply a current through the bias control node in accordance with the bias voltage control signal.

The first switching unit may be constituted by a PNP-type bipolar transistor having a base, collector and emitter electrodes, the base electrode receiving the bias voltage control signal, the collector electrode being connected to the second power supply line, and the emitter electrode being connected to the bias control node.

The second switching unit may be constituted by an N-type MIS transistor, a gate electrode of the N-type MIS transistor receiving the bias voltage control signal. The second switching unit may be constituted by a P-type MIS transistor, a gate electrode of the P-type MIS transistor receiving an inverted signal of the bias voltage control signal through an inverter. The ON-resistance value of the MIS transistor may correspond to a resistance value determined by the bias voltage generation portion. The MIS transistor may be constituted as a long-gate MIS transistor.

The bias voltage generation portion may include a compensation bipolar transistor, connected to the second power supply line and a resistor ($R_2$) connected between the bias control node and the compensation bipolar transistor, for compensating the bias voltage at the predetermined potential. The second switching unit may be switched OFF during the standby period to cut off the current flowing through the compensation bipolar transistor.

The bias voltage generation circuit may further include a resistor connected between the first power supply line and the bias control node in series to the second switching unit, the resistance value of the resistor corresponding to a resistance value determined by the bias voltage generation portion, the second switching unit being mainly used for a switching purpose, and the resistor being mainly used for providing a required resistance value. The bias voltage generation circuit may further comprise a pull-up resistor having a high resistance value, connected between the first power supply line and the bias control node. The first power supply line may be a high-potential power supply line, and the second power supply line may be a low-potential power supply line. The bias voltage generated by the bias voltage generation circuit may be supplied to an emitter coupled logic circuit during the operation period.

BRIEF DESCRIPTION OF THE DRAWINGS

The present invention will be more clearly understood from the description of the preferred embodiments as set forth below with reference to the accompanying drawings, wherein.

DESCRIPTION OF THE PREFERRED EMBODIMENTS

For a better understanding of the preferred embodiments, the problems of the related art will be explained, with reference to FIG. 1.

Figure 1:
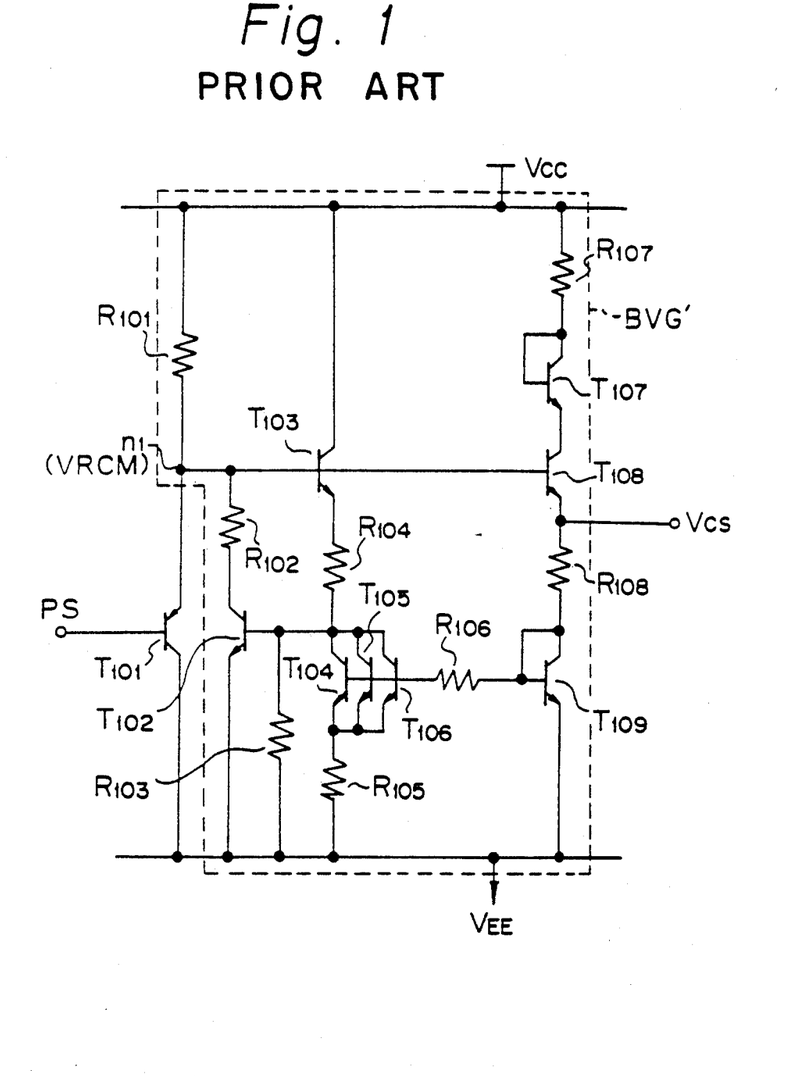
FIG. 1 is a circuit diagram showing an example of a bias voltage generation circuit according to the related art.

FIG. 1 shows an example of a bias voltage generation circuit according to the related art. As shown in FIG. 1, the bias voltage generation circuit comprises a PNP-type bipolar transistor $T_{101}$, a plurality of NPN-type bipolar transistors $T_{102}$ to $T_{109}$, and a plurality of resistors $R_{101}$ to $R_{108}$. The transistor $T_{101}$ has a base electrode connected to a bias voltage control signal input terminal (PS), an emitter electrode, which is a node $n_1$ and generally called VRCM, connected to a high-potential power source (first power supply line) $V_{CC}$ through the resistor $R_{101}$, and a collector electrode connected to a low-potential power source (second power supply line) $V_{EE}$. The transistor $T_{102}$ has a collector electrode connected, through the resistor $R_{102}$, to the emitter electrode (node $n_1$) of the transistor $T_{101}$ as well as to the base electrodes of the transistors $T_{103}$ and $T_{108}$, an emitter electrode connected to the low-potential power source $V_{EE}$, and a base electrode connected to the collector electrodes of the transistors $T_{104}$, $T_{105}$, and $T_{106}$ as well as to the low-potential power source $V_{EE}$ through the resistor $R_{103}$. The transistor $T_{103}$ has a collector electrode connected to the high-potential power source $V_{CC}$, and an emitter electrode connected to the base electrode of the transistor $T_{102}$ through the resistor $R_{104}$.

The base electrodes of the transistors $T_{104}$, $T_{105}$, $T_{106}$ are connected to one another and commonly to the collector and base electrodes of the transistor $T_{109}$ through the resistor $R_{106}$, and the emitter electrodes thereof are connected to one another and to the low-potential power source $V_{EE}$ through the resistor $R_{105}$. The collector electrode of the transistor $T_{107}$ is connected to its base electrode as well as to the high-potential power source $V_{CC}$ through the resistor $R_{107}$, and the emitter electrode thereof is connected to the collector electrode of the transistor $T_{108}$. The emitter electrode of the transistor $T_{108}$ is connected to a bias voltage output terminal Vcs as well as to the collector electrode of the transistor $T_{108}$ through the resistor $R_{108}$. The emitter electrode of the transistor $T_{109}$ is connected to the low-potential power source $V_{EE}$.

Note, the transistors $T_{104}$, $T_{105}$, $T_{106}$, and $T_{109}$ are the same size, and these transistors ($T_{104}$, $T_{105}$, $T_{106}$; $T_{109}$) are used to compensate for the temperature dependency thereof. Further, the transistor $T_{102}$ is used to compensate for the bias voltage Vcs at the predetermined potential (−4.0, or 1.2 volts). In addition, as shown in FIG. 1, a bias voltage generation portion BVG' is constituted by the bipolar transistors $T_{102}$ to $T_{109}$, and the resistors $R_{101}/R_{108}$.

In the above bias voltage generation circuit shown in FIG. 1, for example, a potential of the high-potential power source $V_{CC}$ is defined to be 0 (or 5.2) volts, a potential of the low-potential power source $V_{EE}$ is defined to be −5.2 (or 0) volts, and the bias voltage Vcs is defined to be −4.0 (or 1.2) volts. Further, for example, each resistance value of the resistor $R_{101}$ and the resistor $R_{105}$ is defined to be 20 kΩ.

In the bias voltage generation circuit of FIG. 1, the bias voltage control signal PS supplied to the bias voltage control signal input terminal (PS) is dropped during a standby period (corresponding to a period $t_1$ shown in FIG. 6B) to turn ON the PNP-type bipolar transistor $T_{101}$. Therefore, a level at the node $n_1$ (VRCM) is dropped to decrease an output voltage (bias voltage) Vsc. As a result, power consumption of an ECL circuit to which the bias voltage is supplied is reduced during the standby period.

As described above, the bias voltage generation circuit shown in FIG. 1 turns ON the transistor $T_{101}$ during a standby period to drop a level at the node $n_1$, thereby dropping the output voltage Vcs. The resistance value of the resistor $R_{101}$ must not be too high because it supplies a collector current to the transistor $T_{102}$ during an operation. This means that a current flowing to the resistor $R_{101}$ (which is defined to be about several tens of kilohms may remain as an emitter current to the transistor $T_{101}$ during a standby period. The current flowing to the resistor $R_{101}$ is, for example, about 100 μA, although it depends on a circuit constant. This will be a big problem to be solved, in particular, for radio telephone equipment using a battery backup system.

Below, the preferred embodiments of a bias voltage generation circuit according to the present invention will be explained, with reference to the accompanying drawings.

Figure 2:
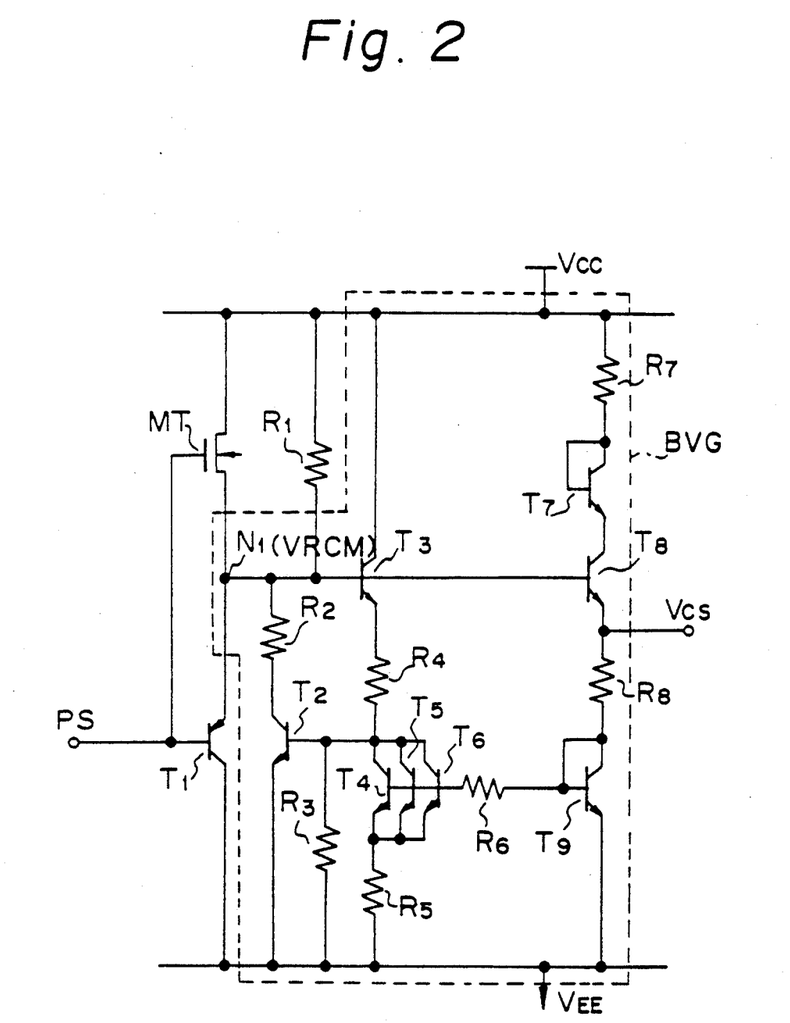
FIG. 2 is a circuit diagram showing a first embodiment of a bias voltage generation circuit according to the present invention.

FIG. 2 is a circuit diagram showing a first embodiment of a bias voltage generation circuit according to the present invention. As shown in FIG. 2, the bias voltage generation circuit of the first embodiment comprises an N-type MIS transistor MT, a PNP-type bipolar transistor $T_1$, a plurality of NPN-type bipolar transistors $T_2$ to $T_9$, and a plurality of resistors $R_1$ to $R_9$.

The transistor $T_1$ has base, collector and emitter electrodes. The base electrode of the transistor $T_1$ is connected to a bias voltage control signal input terminal (PS) as well as to the gate electrode of the MIS transistor MT, the emitter electrode thereof, which is a node $n_1$ and generally called as VRCM, is connected to the drain electrode of the transistor MT, and the collector electrode thereof is connected to a low-potential power source (second power supply line) $V_{EE}$. The source electrode of the transistor MT is connected to a high-potential power source (first power supply line) $V_{CC}$.

The collector electrode of the transistor $T_2$ is connected to the emitter electrode (node $N_1$) of the transistor $T_1$ through the resistor $R_2$. The node $N_1$ (VRCM) is connected to the high-potential power source $V_{CC}$ through the resistor $R_1$ as well as to the base electrodes of the transistors $T_3$ and $T_8$. The emitter electrode of the transistor $T_2$ is connected to the low-potential power source $V_{EE}$, and the base electrode thereof is connected to the collector electrodes of the transistors $T_4$, $T_5$, and $T_6$ as well as to the low-potential power source $V_{EE}$ through the resistor $R_3$. The collector electrode of the transistor $T_3$ is connected to the high-potential power source $V_{CC}$, and the emitter electrode thereof is connected to the base electrode of the transistor $T_2$ through the resistor $R_4$.

The base electrodes of the transistors $T_4$, $T_5$, and $T_6$ are connected to one another and commonly to the collector and base electrodes of the transistor $T_9$ through the resistor $R_6$, and the emitter electrodes thereof are connected to one another and to the low-potential power source $V_{EE}$ through the resistor $R_5$. The collector electrode of the transistor $T_7$ is connected to its base electrode as well as to the high-potential power source $V_{CC}$ through the resistor $R_7$, and the emitter electrode thereof is connected to the collector electrode of the transistor $T_8$. The emitter electrode of the transistor $T_8$ is connected to the bias voltage output terminal (Vcs) as well as to the collector electrode of the transistor $T_9$ through the resistor $R_8$. The emitter electrode of the transistor $T_8$ is connected to the low-potential power source $V_{EE}$.

Note, the transistors $T_4$, $T_5$, $T_6$, and $T_9$ are the same size, and these transistors ($T_4$, $T_5$, $T_6$; $T_9$) are used to compensate for the temperature dependency thereof. Further, the transistor $T_2$ is used to compensate for the bias voltage Vcs at the predetermined potential (−4.0, or 1.2 volts). Namely, the transistor $T_2$ compensates for temperature dependency of the bias voltage Vcs. Further, as shown in FIG. 2, a bias voltage generation portion BVG is constituted by the bipolar transistors $T_2$ to $T_9$, and the resistors $R_2$ to $R_8$.

In the above bias voltage generation circuit shown in FIG. 2, for example, a potential of the high-potential power source $V_{CC}$ is defined to be 0 (or 5.2) volts, a potential of the low-potential power source $V_{EE}$ is defined to be −5.2 (or 0) volts, and the bias voltage Vcs is defined to be −4.0 (or 1.2) volts. Further, for example, the resistance value of the resistor $R_5$ is defined to be 20 kΩ, and the ON-resistance value of the MIS transistor MT is defined to be 20 kΩ. Note, the ON-resistance value of the MIS transistor MT corresponds to that of the resistor $R_{10l}$ shown in FIG. 1.

Next, the operation of the bias voltage generation circuit of FIG. 2 will be explained.

During a standby period (corresponding to a period $t_1$ shown in FIG. 6B) of the bias voltage generation circuit of this embodiment shown in FIG. 2, the bias voltage control signal PS supplied to the bias voltage control signal input terminal (PS) is dropped to turn ON the PNP-type bipolar transistor $T_1$. Therefore, a level at the node $N_l$ falls to set the output voltage (bias voltage) Vcs to a low potential. Note, at this time, the bias voltage control signal PS is also supplied to the gate of the N-type MIS transistor MT, so that the transistor MT is turned OFF by the bias voltage control signal PS. Consequently, almost no current flows through the turned OFF transistor MT and the node $N_l$ during the standby period. In this way, power consumption of an ECL circuit to which the bias voltage is supplied is saved during the standby period. Further, power consumption of the bias voltage generation circuit is also reduced by cutting OFF the current flowing through the MIS transistor MT and the node $N_1$.

During an operation period (corresponding to a period $t_0$ shown in FIG. 6B) in which the bias voltage generation circuit of this embodiment generates a bias voltage of predetermined level, the bias voltage control signal PS supplied to the gate of the N-type MIS transistor MT rises to turn ON the transistor MT. Because of the ON-resistance (for example, several tens of kilohms) of the transistor MT, the transistor functions similar to the resistor $R_{10l}$ of FIG. 1. Namely, during operation, the ON-resistance of the transistor MT works to supply a collector current to the bipolar transistor $T_2$ for providing the bias voltage Vcs of predetermined potential. According to the bias voltage generation circuit of FIG. 2, the gate length of the N-type MIS transistor MT is long enough to provide the ON-resistance of, for example, several kilohms. The resistor $R_l$ of FIG. 2 is a pull-up resistor, which supplies a very weak collector current to the transistor $T_1$. The resistor $R_1$ may have a high resistance value of about several megaohms. Accordingly, a current of several microamperes will flow through the pull-up resistor $R_1$, which causes no problem with power consumption in actual use.

Figure 3:
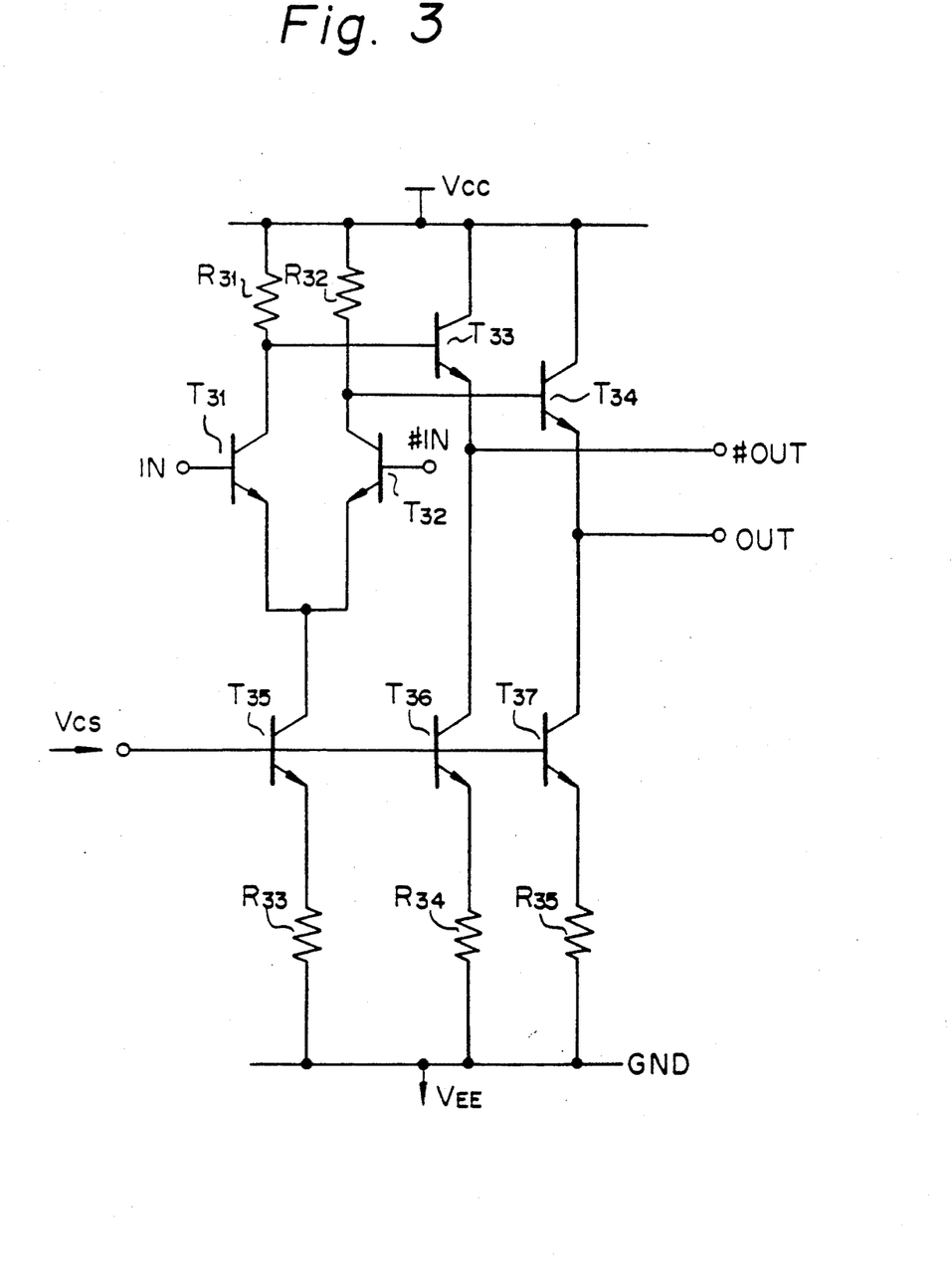
FIG. 3 is a circuit diagram showing an ECL circuit to which the bias voltage generation circuit of the present invention is applicable.

FIG. 3 is a circuit diagram showing an ECL circuit to which the bias voltage generation circuit of the present invention is applicable, and the ECL circuit is a basic one. As shown in FIG. 3, the ECL circuit comprises transistors $T_{3l}$ to $T_{37}$ and resistors $R_{3l}$ to $R_{35}$.

The output (bias voltage) Vcs of the bias voltage generation circuit of the invention is supplied to various ECL circuits. As shown in FIG. 3, for example, the bias voltage Vcs is applied to base electrodes of the transistors $T_{35}$, $T_{36}$, and $T_{37}$ of the ECL circuit, and during a standby period, the bias voltage generation circuit drops the bias voltage Vcs to reduce power consumption in the ECL circuit. Note, the bias voltage generation circuit is applicable for providing a bias voltage to the basic ECL circuit of FIG. 3 as well as other circuits.

Figure 4:
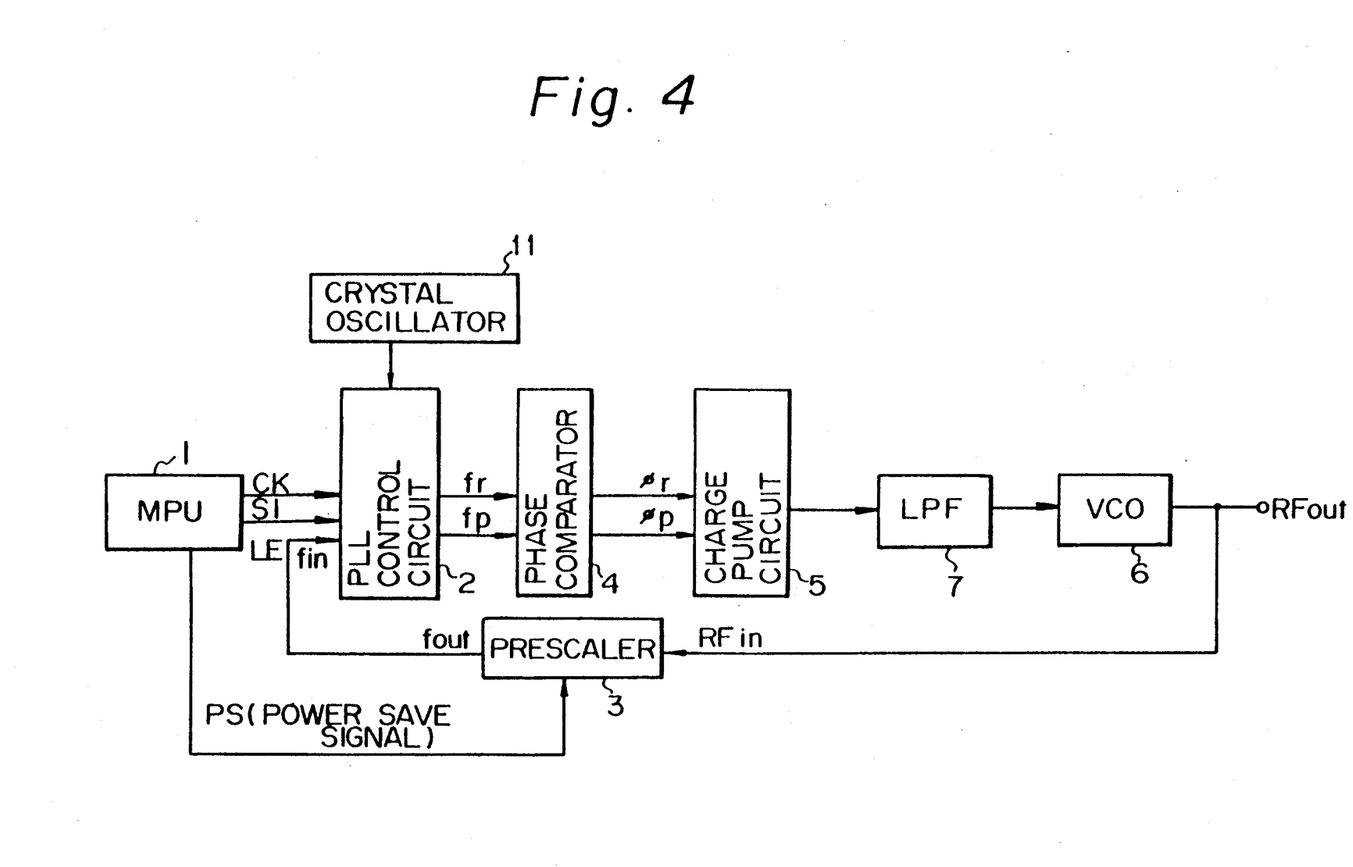
FIG. 4 is a block diagram showing an example of radio telephone equipment using the bias voltage generation circuit of the present invention.

FIG. 4 is a block diagram showing an example of radio telephone equipment using the bias voltage generation circuit of the present invention.

As shown in FIG. 4, the radio telephone equipment, which is generally provided with a battery backup system, comprises a microprocessor unit (MPU) 1, a PLL control circuit 2, a prescaler 3, a phase comparator 4, a charge pump circuit 5, a low pass filter (LPF) 7, a voltage controlled oscillator (VCO) 6, and a crystal oscillator 11. Note, as shown in FIG. 4, the bias voltage generation circuit of the present invention is included in the prescaler 3, and a power save signal (bias voltage control signal) PS is supplied to the bias voltage generation circuit. Further, as shown in FIG. 4, a radio frequency RF ($RF_{out}$, $RF_{in}$) generated by the VCO 6 is returned to the PLL control circuit 2 through the prescaler 3.

Figure 5:
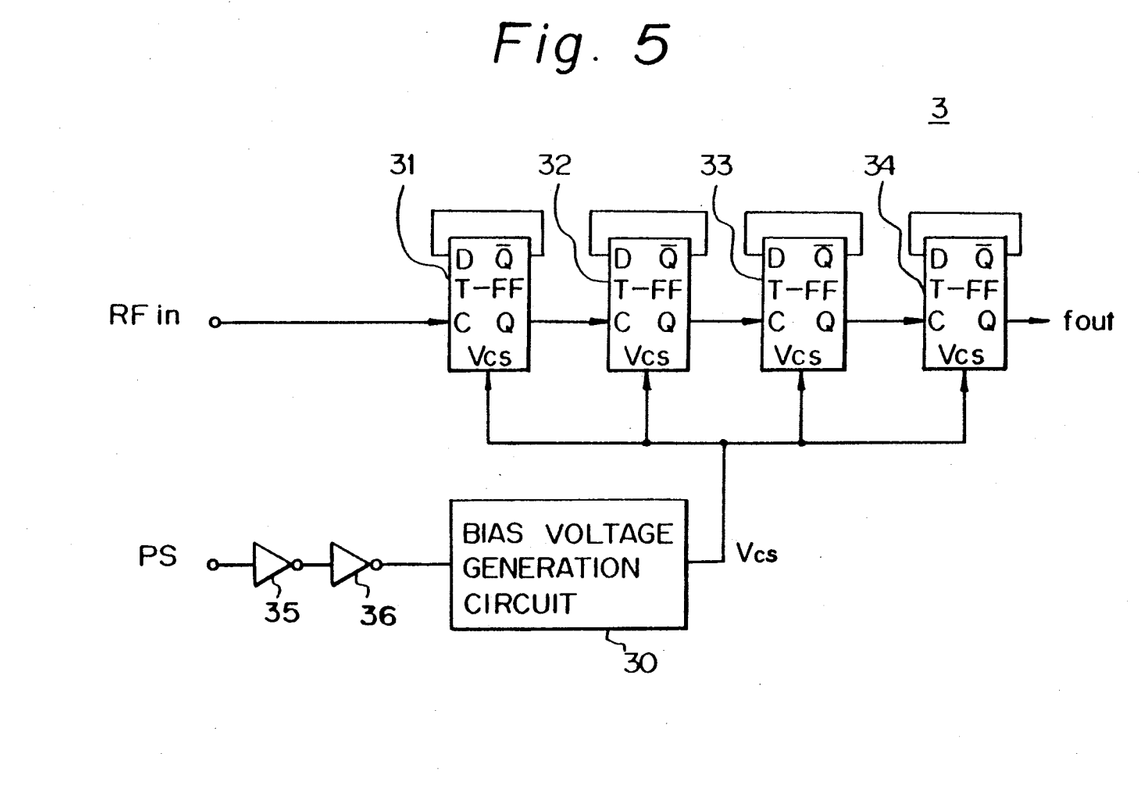
FIG. 5 is a circuit block diagram showing the prescaler shown in FIG. 4.

FIG. 5 is a circuit block diagram showing the prescaler shown in FIG. 4.

As shown in FIG. 5, the prescaler 3 comprises a bias voltage generation circuit 30, four T-type flip-flops 31 to 34, and inverters 35 and 36. Note, the flip-flops 31 to 34 are connected in series, the radio frequency $RF_{in}$ output from the VCO 6 is supplied to the flip-flop 31, and the signal $f_{out}$ output from the flip-flop 34 is supplied to the PLL control circuit 2. Further, the flip-flops 31 to 34 are constituted by ECL circuits to realize a high-speed operation.

The power save signal (bias voltage control signal) PS output from the MPU 1 is supplied to the bias voltage generation circuit 30 through the inverters 35 and 36, and the bias voltage Vcs output from the bias voltage generation circuit 30 is applied to the flip-flops 31 to 34. Note, the bias voltage generation circuit 30 is not only applied to the prescaler 3 of the radio telephone equipment, but the bias voltage generation circuit 30 can also be applied to various ECL circuits.

Figure 6A:
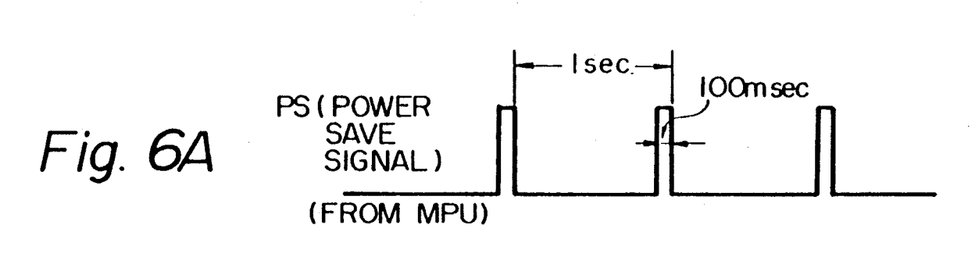
FIGS. 6A, 6B and 6C are timing charts for explaining an operation of the prescaler of FIG. 5.
Figure 6B:
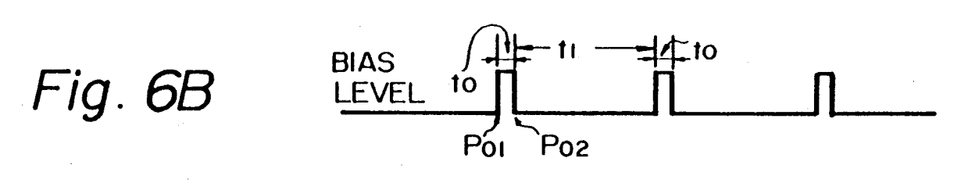
Figure 6C:
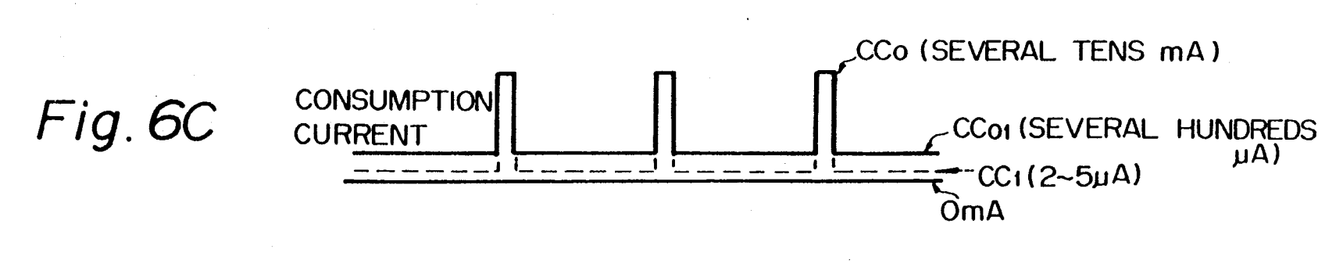

FIGS. 6A to 6C are timing charts for explaining an operation of the prescaler of FIG. 5.

As shown in FIG. 6A, the power save signal (bias voltage control signal) PS is changed to a high level during 100 milliseconds (msec.) by 1 second (sec.). Namely, one period of the power save signal PS is determined to be 1 sec., and the power save signal PS is at a high level during 100 msec. and at a low level during 900 msec. in each period thereof.

In FIG. 6B, a reference $t_0$ denotes an operation period corresponding to the period that the power save signal PS is at a high level, and a reference $t_1$ denotes a standby period corresponding to the period that the power save signal PS is at a low level. Further, a reference $P_{0l}$ denotes a timing of starting the operation of the prescaler 3, and a reference $P_{02}$ denotes a timing of stopping the operation of the prescaler 3.

Namely, as shown in FIGS. 2, 6A to 6C, during the standby period $t_1$, the power save signal PS is dropped to turn ON the PNP-type bipolar transistor $T_1$, and a level at the node $N_l$ falls to set the output voltage (bias voltage) Vcs to a low potential ($-5.2$, or 0 volts). Note, at this time, the power save signal PS is also supplied to the gate of the N-type MIS transistor MT, so that the transistor MT is turned OFF by the power save signal PS. Consequently, as shown in FIG. 6C, almost no current $CC_1$ ($2 \sim 5 \mu$ A) is used by the prescaler 3 during the standby period $t_1$.

On the other hand, during an operation period $t_0$, the power save signal PS rises to turn OFF the PNP-type bipolar transistor $T_1$, and a bias voltage Vcs is returned to a predetermined level ($-4.0$, or 1.2 volts). Further, the N-type MIS transistor MT is turned ON, and the ON-resistance of the transistor MT is provided between the high-potential power source $V_{CC}$ and the $N_1$, so that a collector current of the bipolar transistor $T_2$ for providing the bias voltage Vcs of predetermined potential starts to flow. Consequently, as shown in FIG. 6C, a current $CC_0$ (several tens mA) is used by the prescaler 3 during the operation period $t_0$.

Note, in FIG. 6C, a reference $CC_{0l}$ denotes a consumption current of the related art prescaler using the bias voltage generation circuit shown in FIG. 1 during the standby period $t_1$. Therefore, by applying the bias voltage generation circuit of the present invention, the consumption current of the prescaler 3 can be reduced from the current $CC_{0l}$ (several hundreds $\mu$ A) to the current $CC_l$ ($2 \sim 5 \mu$ A), during the standby period $t_1$.

Figure 7:
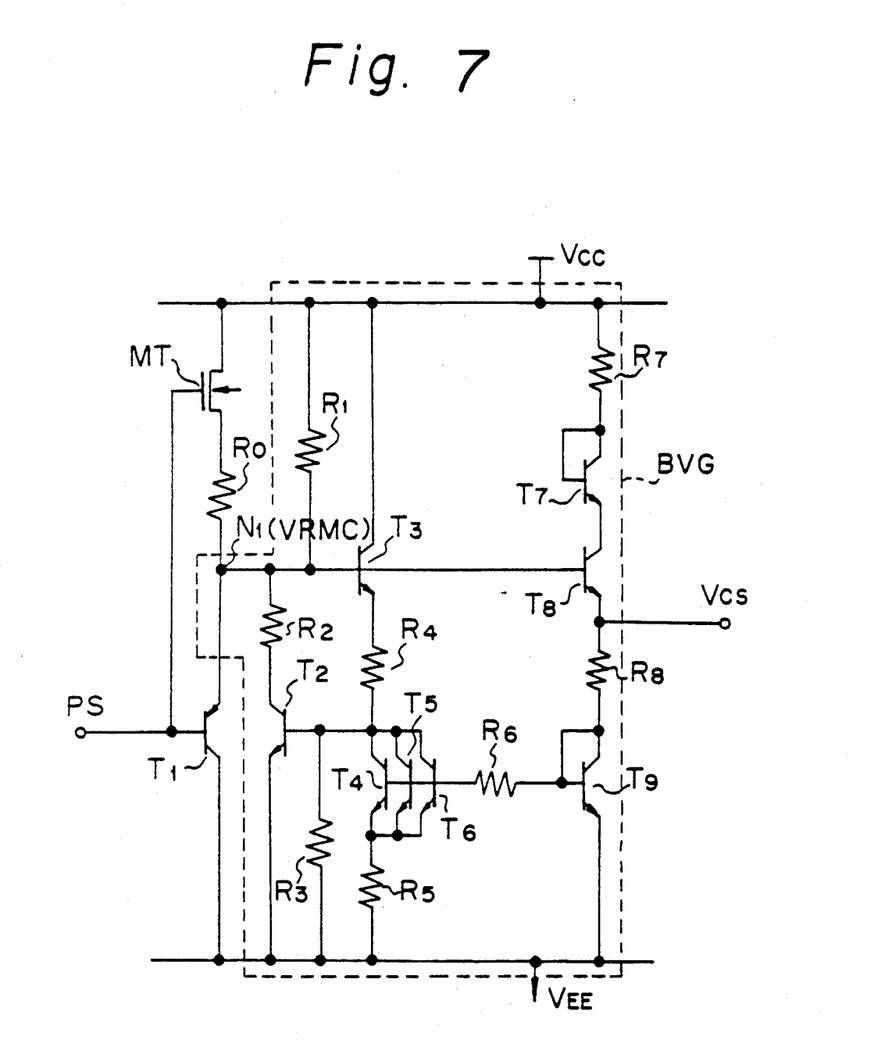
FIG. 7 is a circuit diagram showing a second embodiment of the bias voltage generation circuit according to the present invention.

FIG. 7 is a circuit diagram showing a second embodiment of the bias voltage generation circuit according to the present invention.

By comparing the bias voltage generation circuit shown in FIG. 7 with that shown in FIG. 2, the bias voltage generation circuit shown in FIG. 7 further comprises a resistor $R_0$. The resistor $R_0$ is connected between the N-type MIS transistor MT and the node $N_1$. Note, other parts of this second embodiment are the same as those of the first embodiment of the bias voltage generation circuit shown in FIG. 2.

Note, the ON-resistance of a standard N-type MIS transistor is small, for example, several ohms. Accordingly, the transistor MT is used mainly for switching purposes, and the resistor $R_0$ mainly determines a resistance value (for example, several tens of kilohms while the transistor MT is being ON. In FIG. 7, the resistor $R_0$ is disposed between the drain of the transistor MT and the node $N_1$, but the resistor $R_0$ may be disposed between the high-potential power source $V_{CC}$ and the source of the transistor MT. For example, the ON-resistance value of the transistor MT is determined to be 1 k$\Omega$ (or 100 $\Omega$), and the resistance value of the resistor $R_0$ is determined to be 19 k$\Omega$ (or 19.9 k$\Omega$). In this case, when fluctuating the resistance value of the ON-resistance value of the transistor MT, the total resistance value is mainly due to that of the resistor $R_0$, and thus the manufacturing variation of the transistor MT does not influence to the bias voltage Vcs. Further, as shown in FIG. 7, in this second embodiment, the pull-up resistor $R_1$ is connected parallel with the series-connected MIS transistor MT and resistor $R_0$.

Figure 8:
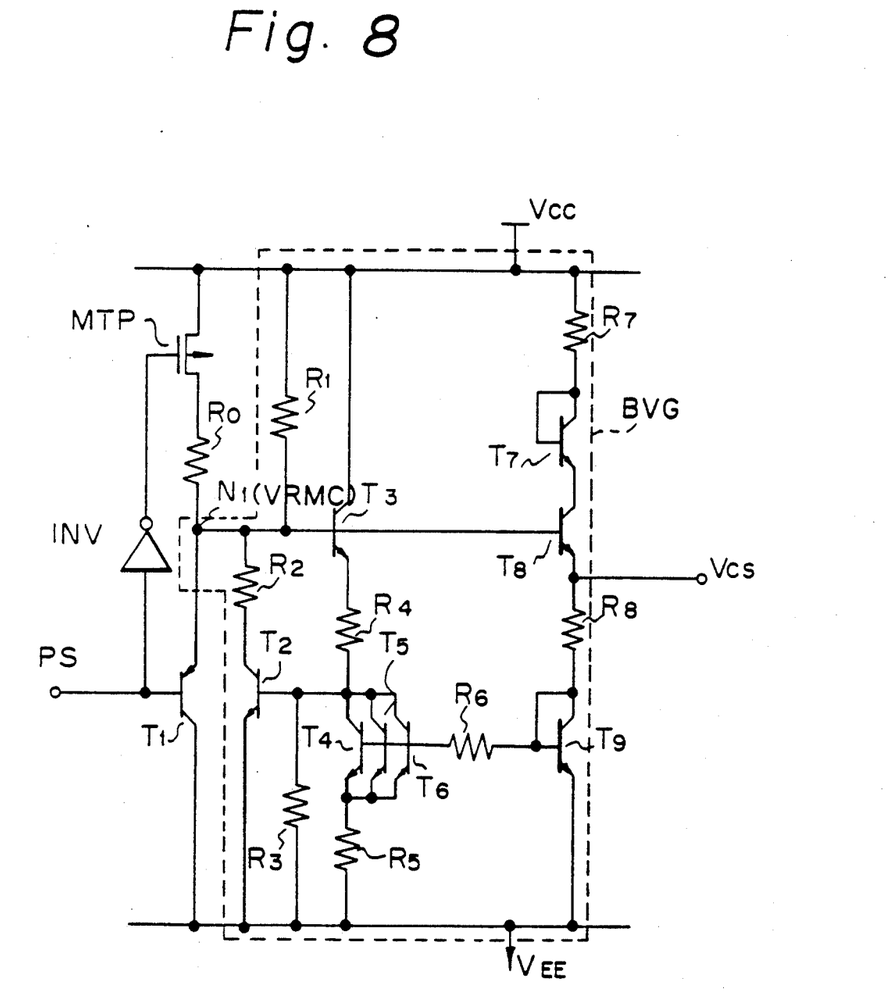
FIG. 8 is a circuit diagram showing a third embodiment of the bias voltage generation circuit according to the present invention.

FIG. 8 is a circuit diagram showing a third embodiment of the bias voltage generation circuit according to the present invention. As shown in FIG. 8, a P-type MIS transistor MTP can be used instead of the N-type MIS transistor MT of FIG. 7. The gate of the P-type MIS transistor MTP receives an inverted signal of the bias voltage control signal PS through an inverter INV.

As described above, in a bias voltage generation circuit according to the present invention, a bias voltage generation circuit generates a bias voltage Vcs of predetermined potential during an operation period and drops the bias voltage during a standby period in response to a bias voltage control signal PS to save power consumption of the ECL circuit to which the bias voltage is supplied. The bias voltage generation circuit comprises a MIS transistor MT (MTP) to be switched ON and OFF in response to the bias voltage control signal. The MIS transistor MT (MTP) is switched OFF during the standby period to cut off current flow and ON during the operation period to supply a current to a bipolar transistor $T_2$ for providing the bias voltage of the predetermined potential.

In the bias voltage generation circuit of the present invention, the MIS transistor MT (MTP) is switched ON and OFF in response to the bias voltage control signal PS. During a standby period, the MIS transistor MT (MTP) is turned OFF to cut off a current, and during an operation period, the MIS transistor MT (MTP) is turned ON to supply a current to the bipolar transistor $T_2$ for providing the bias voltage of the predetermined potential.

As explained above, the bias voltage generation circuits according to the embodiments can reduce a current in the bias voltage generation circuits themselves during a standby period. In particular, the embodiments realize an elongated use with low power consumption required for battery driven communications equipment, etc.

Namely, in accordance with a bias voltage generation circuit of the present invention, the bias voltage generation circuit comprises a MIS transistor to be switched ON and OFF in response to a bias voltage control signal, and current flow is reduced to a negligible amount (less than about 10 $\mu$ A) during a standby period.

Many different embodiments of the present invention may be constructed without departing from the spirit and scope of the present invention, and it should be understood that the present invention is not limited to the specific embodiments described in this specification, except as defined in the appended claims.

We claim:

1. A bias voltage generation circuit supplied with a bias voltage control signal, comprising:
   a first power supply line;
   a second power supply line;
   a bias voltage generation portion having a bias control node, connected between said first power supply line and said second power supply line, for generating a bias voltage of a predetermined potential and supplying said bias voltage to a circuit during an operation period;
   first switching means, connected between said bias control node of said bias voltage generation portion and said second power supply line in parallel with said bias voltage generation portion, for switching ON during a standby period to lower said bias voltage and switching OFF during said operation period based on the bias voltage control signal; and
   second switching means, connected between said bias control node and said first power supply line, for switching OFF during said standby period to cause an impedance between said first switch means and said bias control node to be relatively high and switching ON during said operation period to cause the impedance between said first switching means and said bias control node to be relatively low based on said bias voltage control signal.

2. A bias voltage generation circuit according to claim 1, wherein said first switching means includes a PNP-type bipolar transistor having base, collector and emitter electrodes, said base electrodes receiving said bias voltage control signal, said collector electrode being connected to said second power supply line, and said emitter electrode being connected to said bias control node.

3. A bias voltage generation circuit according to claim 1, wherein said second switching means includes an N-type MIS transistor, a gate electrode of said N-type MIS transistor receiving said bias 4. A bias voltage generation circuit according to claim 3, wherein the ON-resistance value of said N-type MIS transistor corresponds to a resistance value of said bias voltage generation portion.

5. A bias voltage generation circuit according to claim 1, wherein said second switching means is constituted by a P-type MIS transistor, a gate electrode of said P-type MIS transistor receiving an inverted signal of said bias voltage control signal through an inverter.

6. A bias voltage generation circuit according to claim 5, wherein the ON-resistance value of said P-type MIS transistor corresponds to a resistance value of said bias voltage generation portion.

7. A bias voltage generation circuit according to claim 1, wherein said bias voltage generation portion includes a compensation bipolar transistor, connected to said second power supply line and a resistor connected between said bias control node and said compensation bipolar transistor, for compensating said bias voltage at said predetermined potential.

8. A bias voltage generation circuit according to claim 7, wherein said second switching means is switched OFF during said standby period to cut off the current flowing through said compensation bipolar transistor.

9. A bias voltage generation circuit according to claim 1, wherein said bias voltage generation circuit further comprises a resistor connected between said first power supply line and said bias control node in series to said second switching means, the resistance value of said resistor corresponding to a resistance value of said bias voltage generation portion, said second switching means being used mainly for a switching purpose, and said resistor being used mainly for providing a required resistance value.

10. A bias voltage generation circuit according to claim 1, wherein said bias voltage generation circuit further comprises a pull-up resistor having a high resistance value, connected between said first power supply line and said bias control node.

11. A bias voltage generation circuit according to claim 1, wherein said first power supply line is a high-potential power supply line, and said second power supply line is a low-potential power supply line.

12. A bias voltage generation circuit according to claim 1, wherein said bias voltage generated by said bias voltage generation circuit is supplied to an emitter coupled logic circuit during said operation period.

* * * * *

UNITED STATES PATENT AND TRADEMARK OFFICE
CERTIFICATE OF CORRECTION

PATENT NO. : 5,218,238
DATED : June 8, 1993
INVENTOR(S) : Kazuyuki NONAKA et al

It is certified that error appears in the above-indentified patent and that said Letters Patent is hereby corrected as shown below:

- Column 1, line 67, after "may" insert --also--.

- Column 3, line 39, change "$T_{108}$" to --$T_{109}$--.

- Column 4, line 26, change "$R_9$" to --$R_8$--.

UNITED STATES PATENT AND TRADEMARK OFFICE
CERTIFICATE OF CORRECTION

PATENT NO. : 5,218,238
DATED : June 8, 1993
INVENTOR(S) : Kazuyuki NONAKA et al

It is certified that error appears in the above-indentified patent and that said Letters Patent is hereby corrected as shown below:

- Column 4, line 67, change "$T_8$" to --$T_9$--.

- Column 7, line 15, before "$N_1$" insert --node--.

- Column 9, line 15, after "bias" insert --voltage control signal--.

Signed and Sealed this

First Day of March, 1994

Attest:

BRUCE LEHMAN

Attesting Officer     Commissioner of Patents and Trademarks